(12) United States Patent
Min et al.

(10) Patent No.: US 11,496,143 B2
(45) Date of Patent: Nov. 8, 2022

(54) SYNCHRONIZED ELECTRIC METER HAVING AN ATOMIC CLOCK

(71) Applicant: Lawrence Livermore National Security, LLC, Livermore, CA (US)

(72) Inventors: Liang Min, Pleasanton, CA (US); Can Huang, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 168 days.

(21) Appl. No.: 16/988,171

(22) Filed: Aug. 7, 2020

(65) Prior Publication Data

US 2021/0135677 A1 May 6, 2021

Related U.S. Application Data

(60) Provisional application No. 62/928,634, filed on Oct. 31, 2019.

(51) Int. Cl.
*H03L 7/26* (2006.01)
*G04F 5/14* (2006.01)
*G01D 4/00* (2006.01)

(52) U.S. Cl.
CPC ............... *H03L 7/26* (2013.01); *G01D 4/004* (2013.01); *G04F 5/14* (2013.01)

(58) Field of Classification Search
CPC ........................................................ H03L 7/26
See application file for complete search history.

(56) References Cited

U.S. PATENT DOCUMENTS

2006/0158347 A1\* 7/2006 Roche .................... G08C 19/12
340/870.02

\* cited by examiner

*Primary Examiner* — Joseph Chang
(74) *Attorney, Agent, or Firm* — Perkins Coie LLP

(57) ABSTRACT

Smart electric meters configured to perform fast, time-synchronized electrical energy measurements at the consumer-level are disclosed herein. In some embodiments, a smart electric meter includes circuitry configured to measure an electrical value at a location of an end user in a power system. The smart electric meter can further include an atomic clock configured to output a timing signal, and a controller configured to receive (a) the measured electrical value from the circuitry and (b) the timing signal from the atomic clock. The controller can further (a) process the electrical value to generate meter data and (b) generate a time tag based on the timing signal. Then, the controller can associate the time tag with the meter data to generate time-tagged meter data.

20 Claims, 3 Drawing Sheets

SYNCHRONIZED ELECTRIC METER HAVING AN ATOMIC CLOCK

CROSS-REFERENCE TO RELATED APPLICATION

This application claims the benefit of U.S. Provisional Patent Application No. 62/928,634, filed Oct. 31, 2019, and titled "SYNCHRONIZED ELECTRIC METER HAVING AN ATOMIC CLOCK," which is incorporated herein by reference in its entirety.

STATEMENT REGARDING FEDERALLY SPONSORED RESEARCH

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

The present technology generally relates to a smart electric meter having an atomic clock for time synchronizing meter data.

BACKGROUND

An electric meter is a device that measures the amount of electrical energy consumed by residential, commercial, or industrial customers. Traditional electric meters are installed at customers' premises for billing purposes. To obtain the data recorded by such traditional electric meters, a technician must visit the physical location of the electric meter. Such traditional electric meters are gradually being replaced by "smart" electric meters, which can measure electrical energy consumption and also communicate that information between the meter and a central system for billing and monitoring. For example, the U.S. Energy Information Administration reported in December 2017 that almost half of all U.S. electricity customer accounts have smart meters.

In addition to billing and monitoring, it is expected that smart meter data will be increasingly utilized in the management of distributed energy resources (e.g., photovoltaic cells) and controllable loads (e.g., smart consumer appliances). However, current consumer-level smart electric meters record data with large time intervals (e.g., record hourly and report daily) and low quality (e.g., including data incompleteness and loss), bringing significant constraints to their utilization for monitoring and control.

Some distribution and transmission substations on the electric grid include phasor measurement units (PMUs) that allow for higher-precision electrical energy sampling. However, PMUs rely on the Global Positioning System (GPS) to time synchronize electrical phasor measurements. Such GPS-based measurement devices require a connection with a GPS antenna and are susceptible to random GPS loss and cyber-attacks.

DETAILED DESCRIPTION

The present technology is generally directed to electric meters configured to (i) continuously measure electrical quantiles such as voltage, current, power, etc., at the location of an end user in a power system, (ii) calculate meter readings based on the measured electrical quantities, and (iii) time-stamp/tag the meter readings to time synchronize the meter readings. In some embodiments, an electric meter configured in accordance with the present technology can include an atomic clock configured to provide a precise timing signal for use in time-stamping the meter readings. In some embodiments, the atomic clock can be a chip-scale atomic clock that is ultra-low power, compact in size, and low noise. In some embodiments, a plurality of the electric meters can be distributed within a power system (e.g., a grid power system) to provide a synchronized real-time indication of electrical quantities across the power system.

In one aspect of the present technology, the electric meter is configured to time synchronize measured electrical values based on a timing signal from the atomic clock rather than from a conventional GPS-based timing signal. Accordingly, the electric meter need not include a GPS antenna or corresponding wiring as in conventional smart electric meters. This arrangement can improve (i) the ease of installation, (ii) the maintainability, and (iii) the simplicity of the electric meter as compared to conventional electric meters. For example, the electric meter need not be installed in a location that has an unobstructed view of GPS satellites. Moreover, the electric meter can be more stable/reliable as it is not susceptible to random GPS loss or GPS cyber-attacks—which can seriously impact the time synchronization and measurement accuracy of conventional GPS-based devices.

Figure 1:
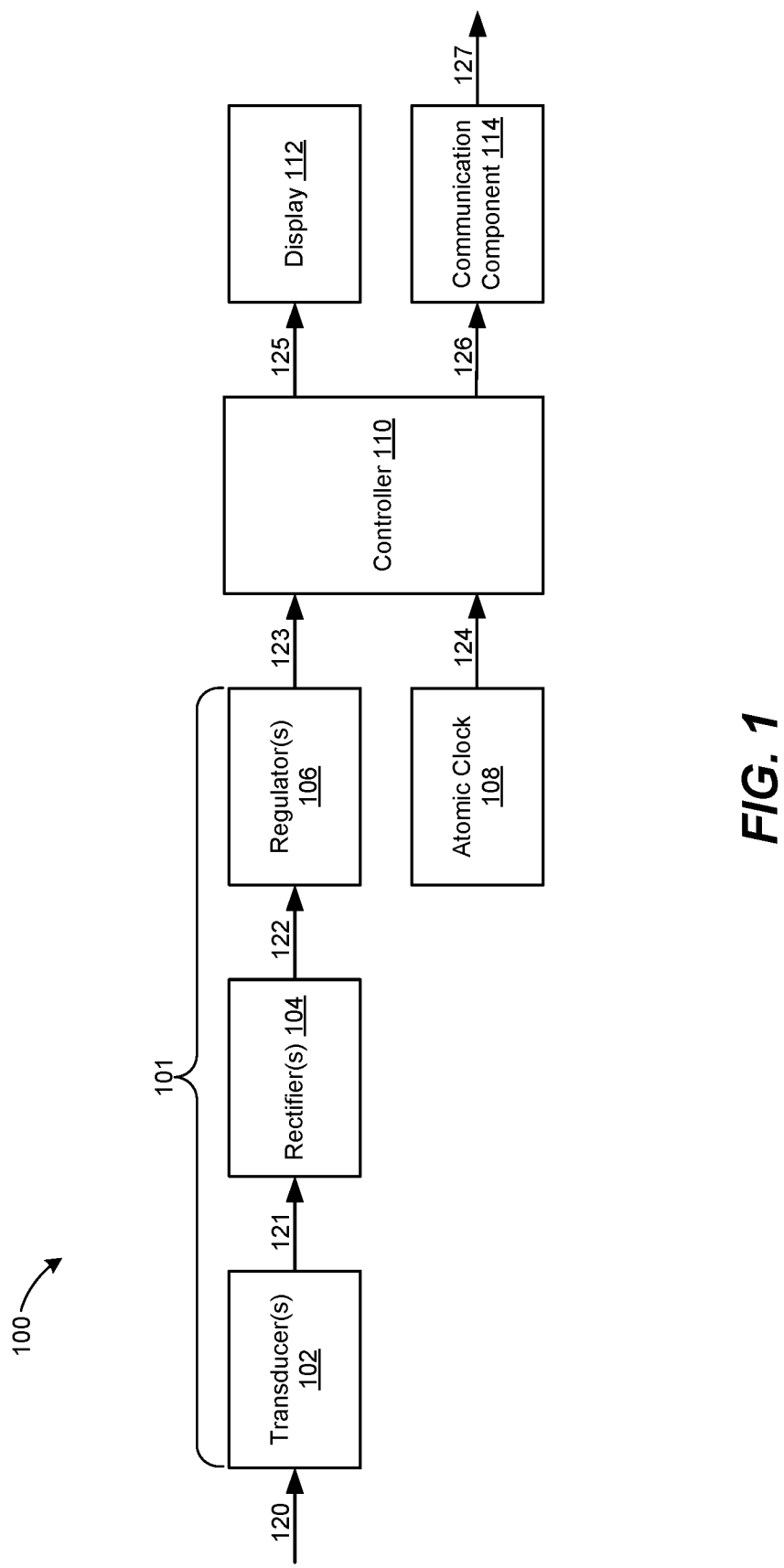
FIG. 1 is a block diagram of an electric meter configured in accordance with some embodiments of the present technology.
Figure 2:
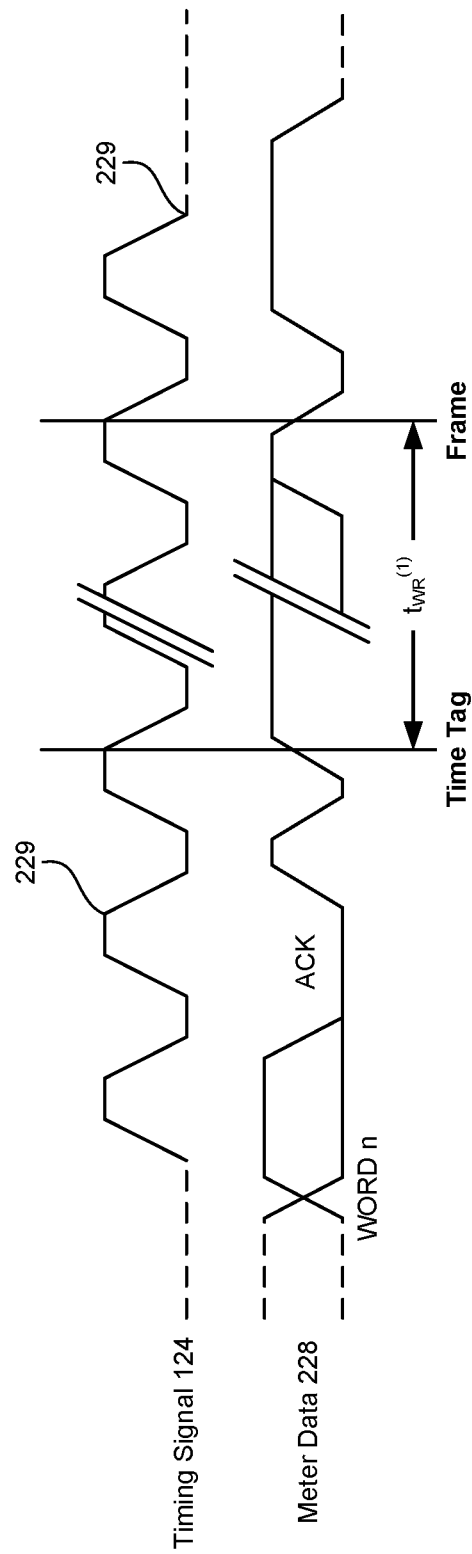
FIG. 2 is a schematic diagram illustrating a timing signal and a signal representing measured meter data in accordance with some embodiments of the present technology.
Figure 3:
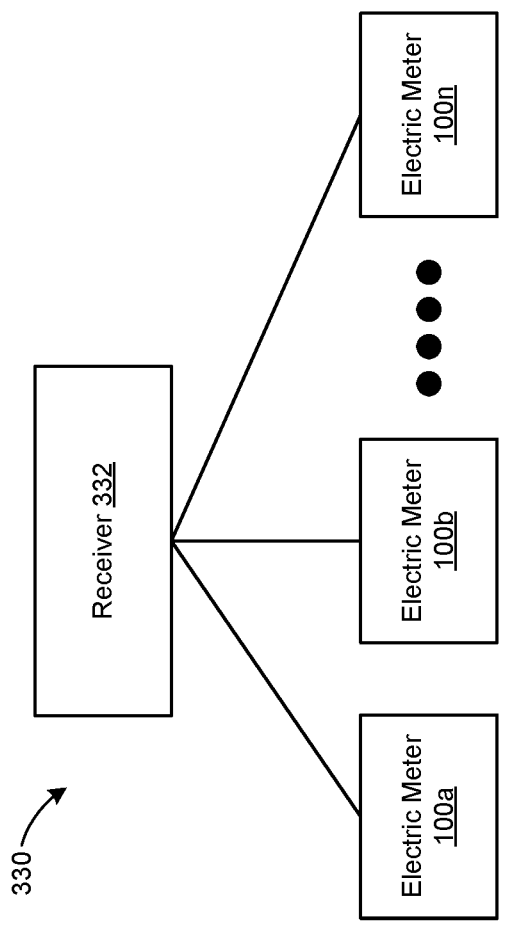
FIG. 3 is a schematic diagram illustrating a portion of a power system including a plurality of the electric meters shown in FIG. 1 configured in accordance with some embodiments of the present technology.

Specific details of several embodiments of the present technology are described herein with reference to FIGS. 1-3. However, the present technology may be practiced without some of these specific details. In some instances, well-known structures and techniques often associated with electric power systems, electric meters, voltage/power calculations, etc., have not been shown/described in detail so as not to obscure the present technology. The terminology used in the description presented below is intended to be interpreted in its broadest reasonable manner, even though it is being used in conjunction with a detailed description of certain specific embodiments of the disclosure. Certain terms may even be emphasized below; however, any terminology intended to be interpreted in any restricted manner will be overtly and specifically defined as such in this Detailed Description section.

FIG. 1 is a block diagram of a smart electric meter 100 configured in accordance with some embodiments of the present technology. The electric meter 100 can be installed at the location of an end user in a power system (e.g., grid power system) such as a residential home, apartment building, individual apartment or unit within the apartment building, housing complex (e.g., small house community), individual house in the housing complex, commercial building, industrial building, etc., and is configured to measure electrical quantities/values such as voltage, current, power, etc. In general, the electric meter 100 is configured to perform fast time-synchronized electrical energy measurements at the consumer-level. As such, the electric meter 100 can be referred to as a time-synchronized electric meter.

The electric meter 100 includes circuitry 101 configured to measure current, voltage, and/or other electric quantities at the location of the end user in the power system. In the illustrated embodiment, the circuitry 101 includes one or more (i) transducers 102, (ii) rectifiers 104, and (iii) regulators 106. In other embodiments, the circuitry 101 can include more or fewer electronic components for measuring electrical quantities and filtering, processing, and/or otherwise conditioning the measured values/signals.

In some embodiments, the transducers 102 can include voltage transducers and current transducers that measure utility voltage and current values, respectively. More specifically, the transducers 102 can be configured to receive and sample high-power analog signals 120 (e.g., voltage and current signals) and to output lower-power analog signals 121. In the illustrated embodiment, the rectifiers 104 receive the lower-power analog signals 121 from the transducers 102 and convert the lower-power analog signals 121 to digital signals. In some embodiments, the rectifiers 104 are further configured to filter out certain harmonics of the analog signals 121. Accordingly, the rectifiers 104 can output filtered, digital signals 122. In the illustrated embodiment, the regulators 106 receive the filtered digital signals 122 and are configured to (i) regulate the filtered digital signals 122 to standard digital signals 123 (e.g., 3.5 volt voltage signals, 5.0 volt voltage signals, etc.), and (ii) output the standard digital signals 123 to a controller 110 (e.g., a microcontroller). The controller 110 is configured to calculate meter data (e.g., meter readings) based on the pre-processed digital signals 123. In some embodiments, the meter data includes one or more of real power, reactive power, power factor, and voltage root mean square (RMS).

In the illustrated embodiment, the electric meter 100 further includes an atomic clock 108 configured to generate a timing signal 124 and to output the timing signal 124 to the controller 110. The timing signal 124 can be a pulse per second (PPS) signal. In some embodiments, the atomic clock 108 can be a chip scale atomic clock (CSAC) that keeps time based on the precise electromagnetic radiation (e.g., microwaves) emitted by electron spin transitions between two hyperfine energy levels in atoms (e.g., cesium atoms). Accordingly, the atomic clock 108 can provide the timing signal 124 independently and with high precision and stability. For example, time drift of the atomic clock 108 can be about 900 nanoseconds per day—equivalent to 3 milliseconds per 10 years—which allows the electric meter 100 to perform high-precision and time-synchronized measurements over a typical life span of the electric meter 100 (e.g., 10-15 years). In some embodiments, the atomic clock 108 can be relatively compact. For example, the atomic clock 108 can have a volume of less than about 17 cubic centimeters and a weight of less than about 35 grams. Moreover, in contrast to global positioning system (GPS) based time sources, the atomic clock 108 can provide the timing signal 124 without requiring an antenna and the associated cables for accessing an external GPS time signal. Moreover, the atomic clock 108 can operate at low power and low noise.

The controller 110 is configured to receive the timing signals 124 and to synchronize the meter readings based on the timing signals 124. For example, the controller 110 can generate time tags at a specific sampling frequency (64 per second, 128 per second, etc.) and associate the time tags with the calculated meter data (e.g., "time-stamp") the meter data. More particularly, FIG. 2 is a schematic diagram illustrating the timing signal 124 and a signal 228 representing the calculated meter data in accordance with some embodiments of the present technology. In the illustrated embodiment, the timing signal 124 is a PPS signal having a plurality of sharply rising or abruptly falling edges 229 ("rising/falling edges 229"). Referring to FIGS. 1 and 2 together, the controller 110 can generate time tags for the signal 228 based on the rising/falling edges 229 of the timing signal 124. In some embodiments, the form and/or mechanism of the timing signal 124 and the signal 228 can be based on, for example, an industry standard 2-wire bus protocol, such as an $I^2C$ protocol with acknowledge "ACK".

Referring again to FIG. 1, the controller 110 can output (i) display signals 125 to a display 112 and (ii) time-tagged meter data signals 126 to a communication component 114. The display 112 can be a liquid-crystal display (LCD) or other type of display and can be configured to receive the display signals 125 and to display the meter data thereon. The display 112 can display the meter data in real time, display aggregates of the meter data, historical meter data, etc. The time-tagged meter data signals 126 can include the measured meter data and the associated time tags. The communication component 114 is configured to receive the time-tagged meter data signals 126 and to convert the signals into frame data 127 (e.g., frames) according to a communication standard such as, for example, the American National Standards Institute (ANSI) standard C12.18 and/or the International Electrotechnical Commission (IEC) standard 61107. In some embodiments, the frame rate can be greater than about 64 frames per second, greater than about 128 frames per second, etc.

The communication component 114 is further configured to transfer the frame data 127 to a local or remote receiver, data concentrator, controller, etc., via a wired or wireless communication path. FIG. 3, for example, is a schematic diagram illustrating a portion of a power system 330 including a receiver 332 communicatively coupled to a plurality of the electric meters 100 (identified individually as electric meters 100a-100n) configured in accordance with some embodiments of the present technology. Referring to FIGS. 1 and 3 together, the electric meters 100 can each transmit the frame data 127 including time-synchronized measurements of electrical quantities local to the electric meters 100 to the receiver 332. The receiver 332 can aggregate the frame data 127 and provide a real-time or near real-time measurement of electrical quantities across the power system 330. By time-synchronizing the sampling processes for the electric meters 100 based on the precise timing signal 124 generated by each of the atomic clocks 108, the receiver 332 can synchronize the measurements from each of the electric meters 100—which may be widely geographically dispersed (e.g., hundreds of miles apart)—to provide a synchronized data set that captures the dynamics of the power system 330. In some embodiments, the power system 330 can include one or more controllers that allow for near-real time or real-time control, monitoring, etc., of distributed energy resources (DERs), controllable loads (e.g., smart appliances), and/or other electric components based on the synchronized data set. Accordingly, the electric meters 100 of the present technology can provide near real-time or real time situational awareness of the power system 330 that enables improved monitoring and control of components within the power system 330.

Referring again to FIG. 1, the electric meter 100 is configured to time synchronize measured electrical values based on the timing signal 124 from the atomic clock 108 rather than from a conventional GPS-based signal. Accordingly, the electric meter 100 need not include a GPS antenna or corresponding wiring as in conventional smart electric meters. In one aspect of the present technology, this improves (i) ease of installation, (ii) maintainability, and (iii) simplicity of the electric meter 100 as compared to conventional electric meters. For example, the electric meter 100 need not be installed in a location that has an unobstructed view of GPS satellites. Moreover, the electric meter 100 is more stable/reliable as it is not susceptible to random GPS loss or GPS cyber-attacks—which can seriously impact the time synchronization and measurement accuracy of conventional GPS-based devices. In another aspect of the present technology, the electric meter 100 can be efficiently integrated into existing systems as it can be compatible with existing meter standards, (e.g., ANSI C12.18 and IEC 61107), and is low-power, low-noise compact, and easy to install.

In some embodiments, the atomic clock 108 and/or the associated circuitry of the controller 110 can be embodied in a separate device (e.g., a "time synchronization module") that can be communicatively coupled to an existing electric meter for providing time synchronization of the electrical values measured by the electric meter. Accordingly, in some embodiments the time synchronization module can be retrofit (e.g., in a "plug and play" configuration) with existing electric meters. For example, such a time synchronization module including the atomic clock 108 can receive measured electrical values from the electric meter and output time synchronized values, as described in detail above. In some embodiments, such a time synchronization module can be located at a position remote from the associated electric meter.

The computing systems (e.g., network nodes or collections of network nodes) on which the smart electric meters and the other described systems may be implemented may include a central processing unit, input devices, output devices (e.g., display devices and speakers), storage devices (e.g., memory and disk drives), network interfaces, graphics processing units, cellular radio link interfaces, global positioning system devices, and so on. The input devices may include keyboards, pointing devices, touch screens, gesture recognition devices (e.g., for air gestures), head and eye tracking devices, microphones for voice recognition, and so on. The computing systems may include high-performance computing systems, cloud-based servers, desktop computers, laptops, tablets, e-readers, personal digital assistants, smartphones, gaming devices, servers, and soon. For example, the simulations and training may be performed using a high-performance computing system, and the classifications may be performed by a tablet. The computing systems may access computer-readable media that include computer-readable storage media and data transmission media. The computer-readable storage media are tangible storage means that do not include a transitory, propagating signal. Examples of computer-readable storage media include memory such as primary memory, cache memory, and secondary memory (e.g., DVD) and other storage. The computer-readable storage media may have recorded on them or may be encoded with computer-executable instructions or logic that implements the smart meters and the other described systems. The data transmission media are used for transmitting data via transitory, propagating signals or carrier waves (e.g., electromagnetism) via a wired or wireless connection. The computing systems may include a secure cryptoprocessor as part of a central processing unit for generating and securely storing keys and for encrypting and decrypting data using the keys.

The smart electric meters and the other described systems may be described in the general context of computer-executable instructions, such as program modules and components, executed by one or more computers, processors, or other devices. Generally, program modules or components include routines, programs, objects, data structures, and so on that perform tasks or implement data types of the smart meters and the other described systems. Typically, the functionality of the program modules may be combined or distributed as desired in various examples. Aspects of the smart meters and the other described systems may be implemented in hardware using, for example, an application-specific integrated circuit ("ASIC") and/or field programmable gate array ("FPGA").

Several aspects of the present technology are set forth in the following examples:

1. An electric meter, comprising:
    circuitry configured to measure an electrical value at a location of an end user in a power system;
    an atomic clock configured to output a timing signal; and
    a controller configured to—
        receive (a) the measured electrical value from the circuitry and (b) the timing signal from the atomic clock;
        process the measured electrical value to generate meter data;
        generate a time tag based on the timing signal; and
        associate the time tag with the meter data to generate time-tagged meter data.

2. The electric meter of example 1 wherein the atomic clock is a chip-scale atomic clock.

3. The electric meter of example 2 wherein the chip-scale atomic clock has a volume of less than about 17 cubic centimeters.

4. The electric meter of example 2 or example 3 wherein the chip-scale atomic clock has a weight of less than about 35 grams.

5. The electric meter of any one of examples 1-4 wherein the timing signal is a pulse per second signal.

6. The electric meter of any one of examples 1-5, further comprising a communication component communicatively coupled to the controller, wherein the communication component is configured to (a) receive the time-tagged meter data and (b) convert the time-tagged meter data into frame data according to a communication standard.

7. The electric meter of any of any one of examples 1-6 wherein the time-tagged meter data includes at least one of real power, reactive power, power factor, and voltage root mean square.

8. The electric meter of any one of examples 1-7 wherein the electric meter does not include a global positioning system (GPS) antenna.

9. The electric meter of example 8 wherein the electric meter does not receive a GPS timing signal.

10. The electric meter of any one of examples 1-9 wherein the circuitry includes—
    a transducer configured to convert high-power analog electrical signals into lower-power analog signals;
    a rectifier electrically coupled to the transducer and configured to receive the lower-power analog signals and to convert the lower-power analog signals to digital signals; and
    a regulator electrically coupled to the rectifier and configured to receive the digital signals and to regulate the digital signals to standard digital signals, wherein the controller is electrically coupled to the regulator and configured to receive the standard digital signals and to process the standard digital signals to generate the meter data.

11. The electric meter of any one of examples 1-10 wherein the timing signal has a plurality of rising and sharply falling edges.

12. A method of synchronizing readings of an electric meter, the method comprising:
  receiving an electrical value measured at an electric meter at a location of an end user in a power system;
  generating, via an atomic clock, a timing signal;
  processing the measured electrical value to generate meter data;
  generating a time tag based on the timing signal; and
  associating the time tag with the meter data to generate time-tagged meter data.

13. The method of example 12 wherein the time tag is one a plurality of time tags, and wherein the method further comprises:
  continuously receiving the electrical value measured at the electric meter at the location of the end user;
  generating the time tags at a selected sampling frequency; and
  successively associating the time tags with the meter data to generate the time-tagged meter data.

14. The method of example 13 wherein the method further comprises converting the time-tagged meter data into a plurality of data frames according to a communication standard.

15. The method of example 14 wherein the method further comprises transferring the data frames to a remote receiver via a communication path.

16. A system for monitoring a power system, comprising:
  a plurality of electric meters each positioned at a location of an end user in the power system, wherein individual ones of the electric meters include—
    circuitry configured to continuously measure an electrical value at the location of the respective one of the end users in the power system;
    an atomic clock configured to output a timing signal; and
    a controller configured to—
      receive (a) the measured electrical value from the circuitry and (b) the timing signal from the atomic clock;
      process the measured electrical value to generate meter data; and
      time stamp the meter data based on the timing signal;
  a receiver communicatively coupled to the electric meters and positioned at a location remote from the electric meters, wherein the receiver is configured to—
    receive the time-stamped meter data from the electric meters; and
    generate a measurement of an electrical quantity across the power system.

17. The system of example 16 wherein the receiver is further configured to time-synchronize the time-stamped meter data received from the electric meters.

18. The system of example 16 or example 17 wherein individual ones of the electric meters do not include a global positioning system (GPS) and do not receive a GPS time signal.

19. The system of any one of examples 16-19, further comprising a controller communicatively coupled to (a) the receiver and (b) at least one load of the power system, wherein the controller is configured to control the at least one load, based on the measurement of the electrical quantity, to reduce an overall load of the power system.

20. The system of any one of examples 16-19, further comprising a controller communicatively coupled to (a) the receiver and (b) at least one energy source of the power system, wherein the controller is configured to control the at least one energy source, based on the measurement of the electrical quantity, to supply power to the power system.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those skilled in the relevant art will recognize. For example, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. It will also be appreciated that specific embodiments have been described herein for purposes of illustration, but that various modifications may be made without deviating from the technology. Further, while advantages associated with some embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. An electric meter, comprising:
  circuitry configured to measure an electrical value at a location of an end user in a power system;
  an atomic clock configured to output a timing signal; and
  a controller configured to—
    receive (a) the measured electrical value from the circuitry and (b) the timing signal from the atomic clock;
    process the measured electrical value to generate meter data;
    generate a time tag based on the timing signal; and
    associate the time tag with the meter data to generate time-tagged meter data.

2. The electric meter of claim 1 wherein the atomic clock is a chip-scale atomic clock.

3. The electric meter of claim 2 wherein the chip-scale atomic clock has a volume of less than about 17 cubic centimeters.

4. The electric meter of claim 2 wherein the chip-scale atomic clock has a weight of less than about 35 grams.

5. The electric meter of claim 1 wherein the timing signal is a pulse per second signal.

6. The electric meter of claim 1, further comprising a communication component communicatively coupled to the controller, wherein the communication component is configured to (a) receive the time-tagged meter data and (b) convert the time-tagged meter data into frame data according to a communication standard.

7. The electric meter of any of claim 1 wherein the time-tagged meter data includes at least one of real power, reactive power, power factor, and voltage root mean square.

8. The electric meter of claim 1 wherein the electric meter does not include a global positioning system (GPS) antenna.

9. The electric meter of claim 8 wherein the electric meter does not receive a GPS timing signal.

10. The electric meter of claim 1 wherein the circuitry includes—
a transducer configured to convert high-power analog electrical signals into lower-power analog signals;
a rectifier electrically coupled to the transducer and configured to receive the lower-power analog signals and to convert the lower-power analog signals to digital signals; and
a regulator electrically coupled to the rectifier and configured to receive the digital signals and to regulate the digital signals to standard digital signals, wherein the controller is electrically coupled to the regulator and configured to receive the standard digital signals and to process the standard digital signals to generate the meter data.

11. The electric meter of claim 1 wherein the timing signal has a plurality of rising and sharply falling edges.

12. A method of synchronizing readings of an electric meter, the method comprising:
receiving an electrical value measured at an electric meter at a location of an end user in a power system;
generating, via an atomic clock of the electric meter, a timing signal;
processing the measured electrical value to generate meter data;
generating a time tag based on the timing signal; and
associating the time tag with the meter data to generate time-tagged meter data.

13. A method of synchronizing readings of an electric meter, the method comprising:
continuously receiving an electrical value measured at an electric meter at a location of an end user in a power system;
generating, via an atomic clock, a timing signal;
processing the measured electrical value to generate meter data;
generating a plurality of time tags at a selected sampling frequency; and
successively associating the time tags with the meter data to generate time-tagged meter data.

14. The method of claim 13 wherein the method further comprises converting the time-tagged meter data into a plurality of data frames according to a communication standard.

15. The method of claim 14 wherein the method further comprises transferring the data frames to a remote receiver via a communication path.

16. A system for monitoring a power system, comprising:
a plurality of electric meters each positioned at a location of an end user in the power system, wherein individual ones of the electric meters include—
circuitry configured to continuously measure an electrical value at the location of the respective one of the end users in the power system;
an atomic clock configured to output a timing signal; and
a controller configured to—
receive (a) the measured electrical value from the circuitry and (b) the timing signal from the atomic clock;
process the measured electrical value to generate meter data; and
time stamp the meter data based on the timing signal;
a receiver communicatively coupled to the electric meters and positioned at a location remote from the electric meters, wherein the receiver is configured to—
receive the time-stamped meter data from the electric meters; and
generate a measurement of an electrical quantity across the power system.

17. The system of claim 16 wherein the receiver is further configured to time-synchronize the time-stamped meter data received from the electric meters.

18. The system of claim 16 wherein individual ones of the electric meters do not include a global positioning system (GPS) and do not receive a GPS time signal.

19. The system of claim 16, further comprising a controller communicatively coupled to (a) the receiver and (b) at least one load of the power system, wherein the controller is configured to control the at least one load, based on the measurement of the electrical quantity, to reduce an overall load of the power system.

20. The system of claim 16, further comprising a controller communicatively coupled to (a) the receiver and (b) at least one energy source of the power system, wherein the controller is configured to control the at least one energy source, based on the measurement of the electrical quantity, to supply power to the power system.

* * * * *